United States Patent
Hong et al.

(10) Patent No.: US 9,385,256 B2
(45) Date of Patent: Jul. 5, 2016

(54) SOLAR CELL PANEL

(71) Applicant: LG ELECTRONICS INC., Seoul (KR)

(72) Inventors: Jongkyoung Hong, Seoul (KR);
Minpyo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/882,148

(22) Filed: Oct. 13, 2015

(65) Prior Publication Data
US 2016/0035926 A1 Feb. 4, 2016

Related U.S. Application Data

(63) Continuation of application No. 12/957,781, filed on Dec. 1, 2010, now Pat. No. 9,166,076.

(30) Foreign Application Priority Data

Jul. 29, 2010 (KR) .......................... 10-2010-0073363

(51) Int. Cl.
*H01L 31/05* (2014.01)
*H01L 31/0224* (2006.01)

(52) U.S. Cl.
CPC .... *H01L 31/0516* (2013.01); *H01L 31/022433* (2013.01); *H01L 31/0512* (2013.01); *Y02E 10/50* (2013.01)

(58) Field of Classification Search
CPC .................... H01L 31/022433; H01L 31/0512
See application file for complete search history.

(56) References Cited

U.S. PATENT DOCUMENTS

| | | | | |
|---|---|---|---|---|
| 3,966,499 A * | 6/1976 | Yasui | .............. | H01L 31/022433 |
| | | | | 136/206 |
| 6,175,075 B1 * | 1/2001 | Shiotsuka | ............... | B32B 17/04 |
| | | | | 136/244 |
| 8,420,927 B2 * | 4/2013 | Lee | ................. | H01L 31/022433 |
| | | | | 136/251 |

(Continued)

FOREIGN PATENT DOCUMENTS

| | | |
|---|---|---|
| EP | 1928027 A2 | 6/2000 |
| EP | 2063372 A1 | 6/2009 |

(Continued)

OTHER PUBLICATIONS

Tanaka et al., "Effects of electrode contact area reduction using an excimer laser," Surface micro-machining of AR layers, Solar Energy Materials, vol. 23, No. 2/4, Dec. 23, 1991, Amsterdam, NL, pp. 206-211, XP 000263506.

*Primary Examiner* — Golam Mowla
(74) *Attorney, Agent, or Firm* — Birch, Stewart, Kolasch & Birch, LLP

(57) ABSTRACT

A solar cell panel is discussed, which includes a plurality of solar cells, each solar cell including a substrate having a first surface and a second surface opposite the first surface, and a plurality of first electrodes extending in a first direction; an interconnector that is positioned in a second direction crossing the plurality of first electrodes and electrically connects adjacent ones of the plurality of solar cells to one another; and a conductive adhesive film including a resin and a plurality of conductive particles dispersed in the resin, the conductive adhesive film being positioned between the plurality of first electrodes and the interconnector in the second direction crossing the plurality of first electrodes to electrically connect the plurality of first electrodes to the interconnector.

12 Claims, 5 Drawing Sheets

(56) References Cited

U.S. PATENT DOCUMENTS

| | | | |
|---|---|---|---|
| 2005/0172996 A1* | 8/2005 | Hacke | H01L 31/022433 136/256 |
| 2005/0194037 A1* | 9/2005 | Asai | H01L 31/022425 136/256 |
| 2007/0095387 A1* | 5/2007 | Fujii | H01L 31/0512 136/251 |
| 2007/0186968 A1 | 8/2007 | Nakauchi et al. | |
| 2007/0295381 A1* | 12/2007 | Fujii | H01L 31/022433 136/244 |
| 2008/0000519 A1 | 1/2008 | Takahashi | |
| 2008/0121265 A1 | 5/2008 | Hishida et al. | |
| 2008/0149161 A1* | 6/2008 | Nishida | H01L 31/022433 136/244 |
| 2008/0196757 A1 | 8/2008 | Yoshimine | |
| 2008/0276981 A1* | 11/2008 | Kinoshita | H01L 31/022425 136/244 |
| 2009/0038675 A1 | 2/2009 | Tsunomura et al. | |
| 2009/0078305 A1* | 3/2009 | Nishiwaki | H01L 31/022433 136/249 |
| 2009/0139570 A1* | 6/2009 | Kinoshita | H01L 31/03762 136/256 |
| 2009/0277491 A1 | 11/2009 | Nakamura et al. | |
| 2010/0275964 A1* | 11/2010 | Kinoshita | H01L 31/022433 136/244 |

FOREIGN PATENT DOCUMENTS

| | | |
|---|---|---|
| EP | 2 086 022 A1 | 8/2009 |
| JP | 2004-140024 A | 5/2004 |
| JP | 2005-353851 A | 12/2005 |
| JP | 2009-99574 A | 5/2009 |
| JP | 2009-147050 A | 7/2009 |
| JP | 2009-147051 A | 7/2009 |
| JP | 2009-147052 A | 7/2009 |

* cited by examiner

SOLAR CELL PANEL

CROSS-REFERENCE TO RELATED APPLICATIONS

This application is a continuation of co-pending U.S. patent application Ser. No. 12/957,781 filed on Dec. 1, 2010, which claims priority to Korean Patent Application No. 10-2010-0073363 filed in the Republic of Korea on Jul. 29, 2010. The entire contents of all of the above applications are hereby incorporated by reference.

BACKGROUND OF THE INVENTION

1. Field of the Invention

Example embodiments of the invention relate to a solar cell panel in which adjacent solar cells are electrically connected to one another using an interconnector.

2. Description of the Related Art

Solar power generation to convert light energy into electric energy using a photoelectric transformation effect has been widely used as a method for obtaining eco-friendly energy. A solar power generation system using a plurality of solar cell panels has been installed in places, such as houses due to an improvement in a photoelectric transformation efficiency of solar cells.

The solar cell panel includes an interconnector for electrically connecting a plurality of solar cells to one another, front and back protective members for protecting the solar cells, and a sealing member that is positioned between the front and back protective members to seal the solar cells.

SUMMARY OF THE INVENTION

In one aspect, there is a solar cell panel including a plurality of solar cells, an interconnector electrically connecting adjacent ones of the plurality of solar cells to one another, and a conductive adhesive film positioned between at least one of the plurality of solar cells and the interconnector.

Each of the plurality of solar cells includes a substrate of a first conductive type, an emitter layer that is positioned at a light receiving surface of the substrate and which forms a p-n junction along with the substrate, and a plurality of front electrodes extending in a first direction and electrically connected to the emitter layer.

The interconnector is positioned in a second direction crossing the plurality of front electrodes. The conductive adhesive film disposed between the substrate and the interconnector includes a resin and a plurality of conductive particles dispersed in the resin. Further, the conductive adhesive film is positioned between the plurality of front electrodes and the interconnector in the second direction crossing the plurality of front electrodes and electrically connects the plurality of front electrodes to the interconnector. The plurality of front electrodes respectively have areas that overlap with areas of the conductive adhesive film, and the areas of the respective plurality of front electrodes are also in contact with the areas of the conductive adhesive film.

Each of the plurality of front electrodes includes a first portion directly contacting at least one of the areas of the conductive adhesive film and a second portion not contacting the conductive adhesive film.

The plurality of conductive particles may directly contact the first portion of the each front electrode and the interconnector. The resin may be positioned between the plurality of conductive particles and the first portion of the each front electrode and between the plurality of conductive particles and the interconnector.

The plurality of conductive particles may be electrically connected to one another, so that when carriers moving to the front electrodes move through the adjacent conductive particles, a current smoothly flows.

The plurality of conductive particles may directly contact the first portion of the each front electrode and the interconnector, so as to efficiently transfer the carriers moving to the front electrodes to the interconnector. Preferably, though not required, the plurality of conductive particles may directly contact both the first portion of each front electrode and the interconnector.

Each of the plurality of solar cells may further include an anti-reflection layer positioned on the emitter layer on which the plurality of front electrodes are not positioned. A portion of the conductive adhesive film directly contacts the anti-reflection layer.

The plurality of front electrodes protrude further from the surface of the substrate than a structure of the substrate surface, for example, the emitter layer or the anti-reflection layer. Further, a plane area of the front electrode is less than a plane area of the anti-reflection layer.

When the conductive adhesive film is attached to the front electrode and the anti-reflection layer, a pressure applied to a portion of the conductive adhesive film attached to the front electrode is greater than a pressure applied to a portion of the conductive adhesive film attached to the anti-reflection layer. Because of the reason, an adhesive strength of the portion of the conductive adhesive film attached to the front electrode is greater than an adhesive strength of the portion of the conductive adhesive film attached to the structure of the substrate surface in the direction crossing the front electrode. Thus, carrier moving to the plurality of front electrodes may be sufficiently transferred to the interconnector.

The first portion and the second portion of the each front electrode may have substantially the same width. Alternatively, the first portion and the second portion of at least one of the plurality of front electrodes may have different widths.

When the width of the first portion is different from the width of the second portion, for example, when the width of the first portion is greater than the width of the second portion, the adhesive strength between the front electrode and the conductive adhesive film is improved, and a contact resistance between the front electrode and the conductive adhesive film decreases. Hence, an output reduction may be prevented, The first portion has a predetermined length in a longitudinal direction of the front electrode. The predetermined length of the first portion is equal to or less than a width of the conductive adhesive film.

The first portion may be formed in each of the plurality of front electrodes positioned on predetermined rows. The first portion may be formed in each of the plurality of front electrodes positioned on all of rows.

The first portion may be formed in an up-down symmetric manner or an up-down asymmetric manner based on a longitudinal direction of the front electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1:
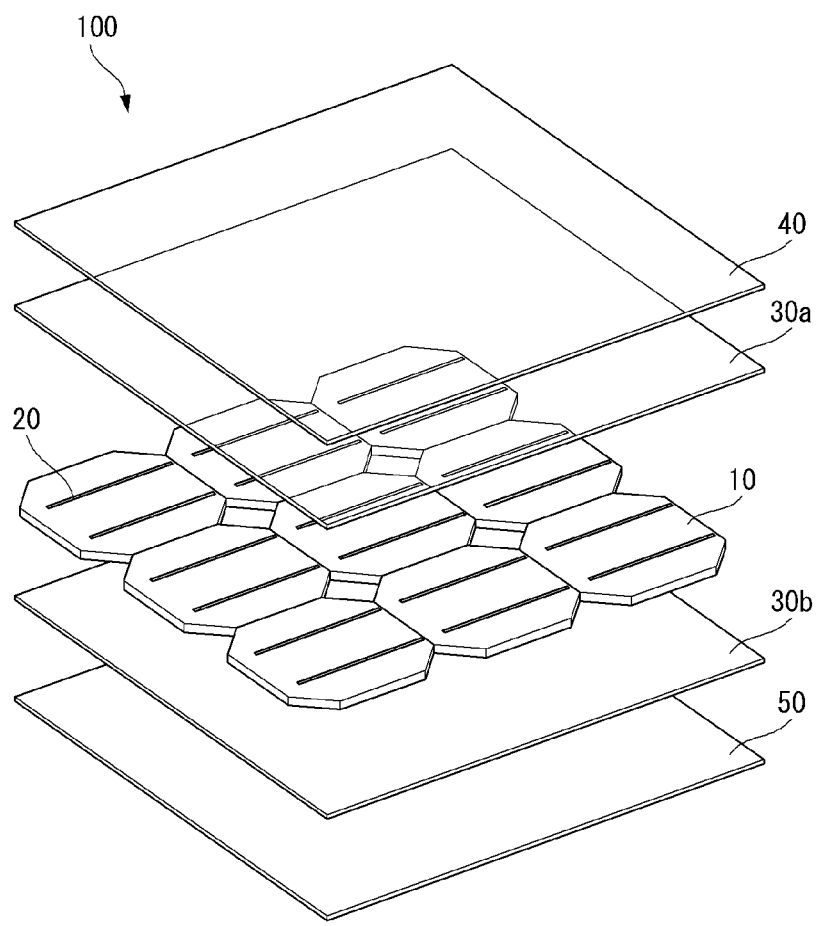
FIG. 1 is an exploded perspective view of a solar cell panel according to an example embodiment of the invention.

The invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is an exploded perspective view of a solar cell panel according to an example embodiment of the invention. As shown in FIG. 1, a solar cell panel 100 according to an example embodiment of the invention includes a plurality of solar cells 10, interconnectors 20 for electrically connecting the solar cells 10 to one another, front and back protective layers (or first and second protective layers) 30a and 30b for protecting the solar cells 10, a transparent member 40 positioned on the front protective layer 30a on light receiving surfaces (front or first surfaces) of the solar cells 10, and a back sheet 50 underlying the back protective layer 30b on surfaces (back or second surfaces) opposite the light receiving surfaces of the solar cells 10.

The back sheet 50 prevents moisture or oxygen from penetrating into a back surface of the solar cell panel 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

In a double-sided light receiving solar cell, a glass or a resin having a light transparency may be used instead of the back sheet 50.

The front and back protective layers 30a and 30b and the solar cells 10 form an integral body when a lamination process is performed in a state where the front and back protective layers 30a and 30b are respectively positioned on front surfaces and back surfaces of the solar cells 10. The front and back protective layers 30a and 30b prevent corrosion of metal resulting from the moisture penetration and protect the solar cells 10 from an impact. The front and back protective layers 30a and 30b may be formed of a material such as ethylene vinyl acetate (EVA). Other materials may be used.

The transparent member 40 on the front protective layer 30a may be formed of a tempered glass having a high light transmittance and excellent damage prevention characteristic. The tempered glass may be a low iron tempered glass containing a small amount of iron. The transparent member 40 may have an embossed inner surface so as to increase a scattering effect of light.

As shown in FIG. 1, the plurality of solar cells 10 is arranged in a matrix structure. Although FIG. 1 illustrates that the solar cells 10 on the back protective layer 30b have a structure of a 3×3 matrix, the number of solar cells 10 in row and/or column directions may vary, if necessary or desired.

Figure 2:
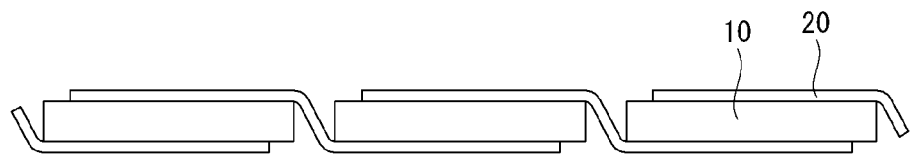
FIG. 2 schematically illustrates an electrical connection structure between a plurality of solar cells of the solar cell panel shown in FIG. 1.

As shown in FIG. 2, the plurality of solar cells 10 is electrically connected to one another by using interconnectors 20. More specifically, an electrode part formed on a front surface of one solar cell 10 is electrically connected to an electrode part formed on a back surface of another solar cell 10 adjacent to the one solar cell 10 using the interconnector 20 in a state where the plurality of solar cells 10 are positioned adjacently to one another.

Figure 3:
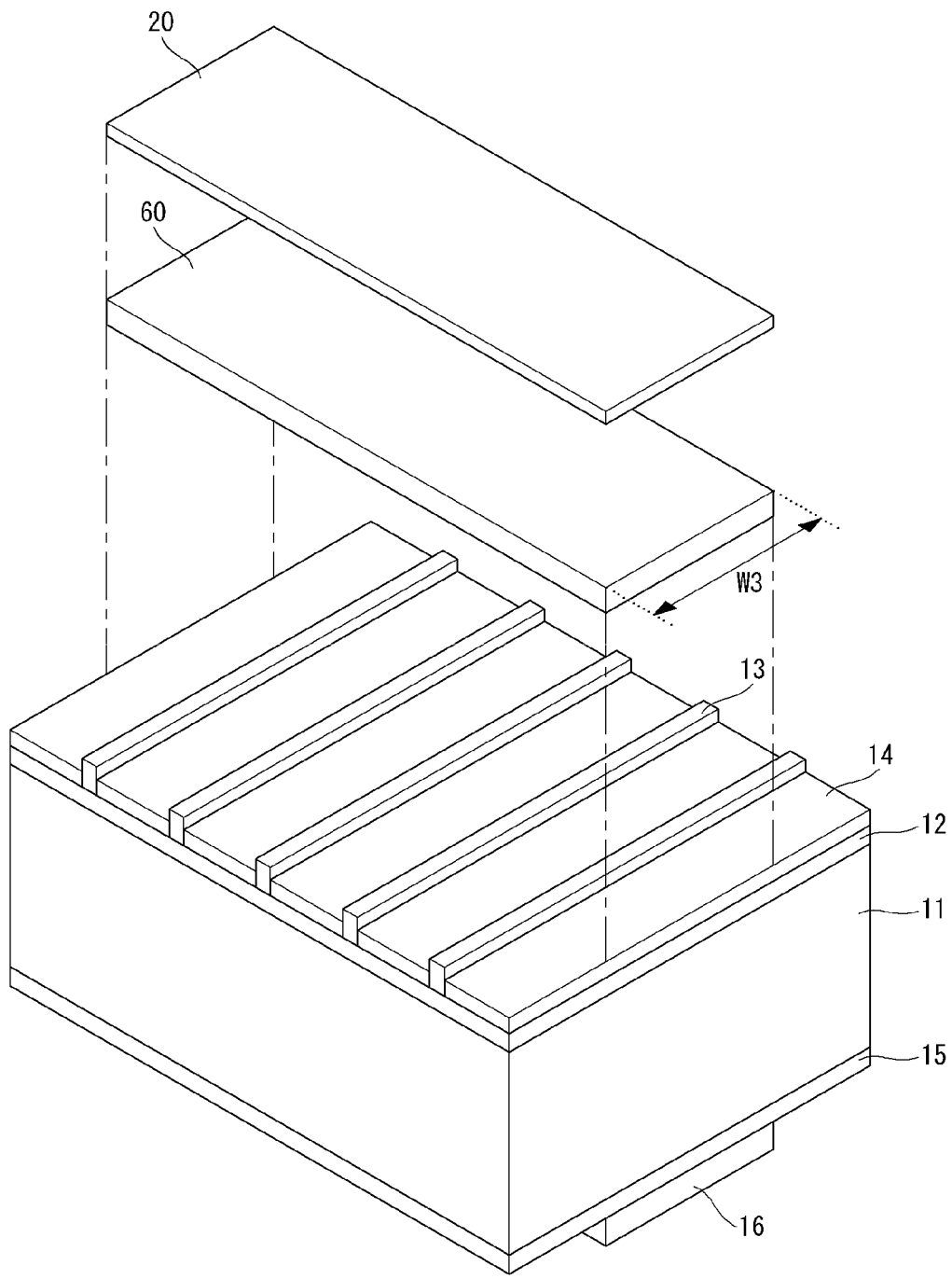
FIG. 3 is an exploded perspective view of main components of a solar cell in the solar cell panel shown in FIG. 2.
Figure 4:
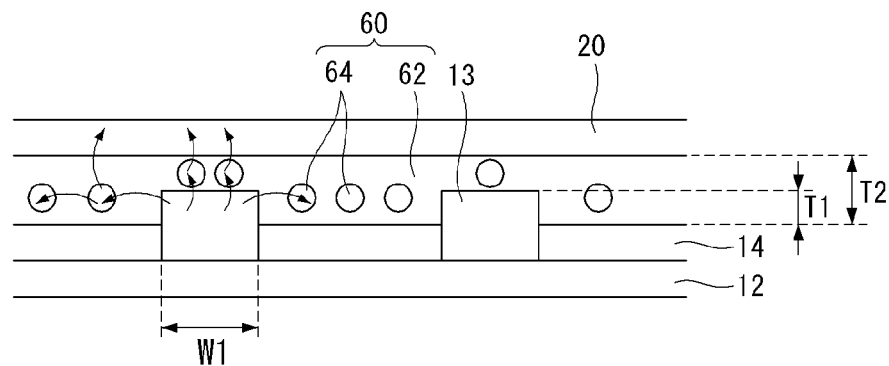
FIG. 4 is a cross-sectional view illustrating an assembly configuration of the solar cell in the solar cell panel shown in FIG. 3.
Figure 5:
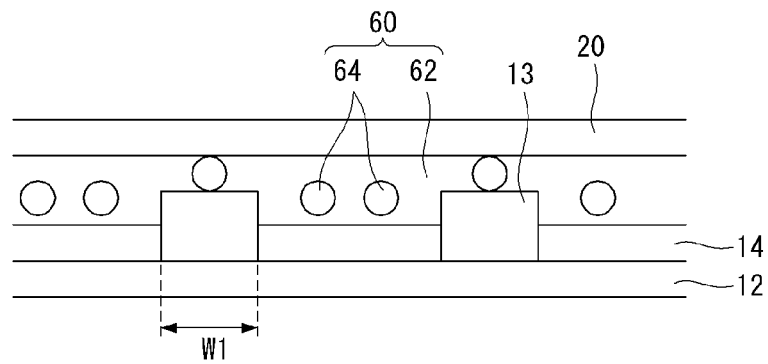
FIG. 5 is a cross-sectional view illustrating another assembly configuration of the solar cell in the solar cell panel shown in FIG. 3.

FIG. 3 is an exploded perspective view of main components of a solar cell in the solar cell panel shown in FIG. 1. FIG. 4 is a cross-sectional view illustrating an assembly configuration of the solar cell in the solar cell panel shown in FIG. 3. FIG. 5 is a cross-sectional view illustrating another assembly configuration of the solar cell in the solar cell panel shown in FIG. 3.

As shown in FIG. 3, the solar cell 10 includes a substrate 11, an emitter layer 12 positioned at a front surface (for example, a light receiving surface on which light is incident) of the substrate 11, a plurality of front electrodes 13 positioned on the emitter layer 12, an anti-reflection layer 14 positioned on the emitter layer 12 on which the plurality of front electrodes 13 are not positioned, a back electrode 15 positioned on a surface opposite the light receiving surface of the substrate 11, and a back electrode current collector 16 positioned on a back surface of the back electrode 15.

The solar cell 10 may further include a back surface field (BSF) layer between the back electrode 15 and the substrate 11. The back surface field layer is a region (e.g., a $p^+$-type region) that is more heavily doped with impurities of the same conductive type as the substrate 11 than the substrate 11. The back surface field layer serves as a potential barrier of the substrate 11. Thus, because a recombination and/or a disappearance of electrons and holes around the back surface of the substrate 11 are prevented or reduced, the efficiency of the solar cell 10 is improved.

The substrate 11 is a semiconductor substrate, which may be formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In).

The surface of the substrate 11 may be textured to form a textured surface corresponding to an uneven surface or having uneven characteristics having a plurality of uneven portions. When the surface of the substrate 11 is the textured surface, a light reflectance at the light receiving surface of the substrate 11 is reduced. Further, because both a light incident operation and a light reflection operation are performed on the textured surface of the substrate 11, light is confined in the solar cell 10. Hence, a light absorption increases, and the efficiency of the solar cell 10 is improved. In addition, because a reflection loss of light incident on the substrate 11 decreases, an amount of light incident on the substrate 11 further increases.

The emitter layer 12 is a region doped with impurities of a second conductive type (for example, an n-type) opposite the first conductive type of the substrate 11. The emitter layer 12 forms a p-n junction along with the substrate 11. When the emitter layer 12 is to be of the n-type, the emitter layer 12 may be formed by doping the substrate 11 with impurities of a group V element such as phosphor (P), arsenic (As), and antimony (Sb).

When energy of light incident on the substrate 11 is applied to the semiconductors of the substrate 11, carriers (e.g., electron-hole pairs) are produced inside the semiconductors, and electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and/or may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this instance, electrons move to the n-type substrate 11 and holes move to the p-type emitter layer 12.

When the emitter layer 12 is of the p-type, the emitter layer 12 may be formed by doping a portion of the substrate 11 with impurities of a group III element such as boron (B), gallium (Ga), and indium (In).

The anti-reflection layer 14 on the emitter layer 12 may be formed of silicon nitride (SiNx), silicon dioxide (SiO$_2$), or titanium dioxide (TiO$_2$). The anti-reflection layer 14 reduces a reflectance of light incident on the solar cell 10 and increases a selectivity of a predetermined wavelength band of the incident light, thereby increasing the efficiency of the solar cell 10. The anti-reflection layer 14 may have a thickness of about 70 nm to 80 nm. The anti-reflection layer 14 may be omitted, if desired.

The plurality of front electrodes 13 on the emitter layer 12 are electrically and physically connected to the emitter layer 12 and are formed in one direction in a state where the adjacent front electrodes 13 are spaced apart from one another. Each of the front electrodes 13 collects carriers (e.g., electrons) moving to the emitter layer 12. Each of the front electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 13.

For example, the front electrodes 13 may be formed of an Ag paste containing lead (Pb). In this instance, the front electrodes 13 may be electrically connected to the emitter layer 12 by way of a process in which the Ag paste is coated on the anti-reflection layer 14 using a screen printing method and the substrate 11 is fired at a temperature of about 750° C. to 800° C. The electrical connection between the front electrodes 13 and the emitter layer 12 is performed by etching the anti-reflection layer 14 using lead (Pb) contained during the Ag paste in the firing process and which then brings Ag particles of the Ag paste into contact with the emitter layer 12.

The back electrode 15 is formed on the surface (i.e., the back surface of the substrate 11) opposite the light receiving surface of the substrate 11. The back electrode 15 collects carriers (e.g., holes) moving to the substrate 11. The back electrode 15 is formed of at least one conductive material. The conductive material may be at least one selected from the group consisting of Ni, Cu, Ag, Al, Sn, Zn, In, Ti, Au, and a combination thereof. Other conductive materials may be used for the back electrode 15.

The back electrode current collector 16 is positioned under the back electrode 15 in a direction crossing the front electrodes 13 and is electrically connected to the back electrode 15. Thus, the back electrode current collector 16 outputs the carriers (e.g., holes) transferred from the back electrode 15 to an external device. The back electrode current collector 16 is formed of at least one conductive material. The conductive material may be at least one selected from the group consisting of Ni, Cu, Ag, Al, Sn, Zn, In, Ti, Au, and a combination thereof. Other conductive materials may be used for the back electrode current collector 16.

As shown in FIG. 2, the solar cells 10 each having the above-described configuration are electrically connected to one another using the interconnectors 20.

More specifically, a plurality of conductive adhesive films 60 are formed on the emitter layer 12 in direction crossing the front electrodes 13.

Although FIG. 3 shows only one conductive adhesive film 60, two or three conductive adhesive films 60 may be positioned on the front surface of the substrate 11.

Figure 6:
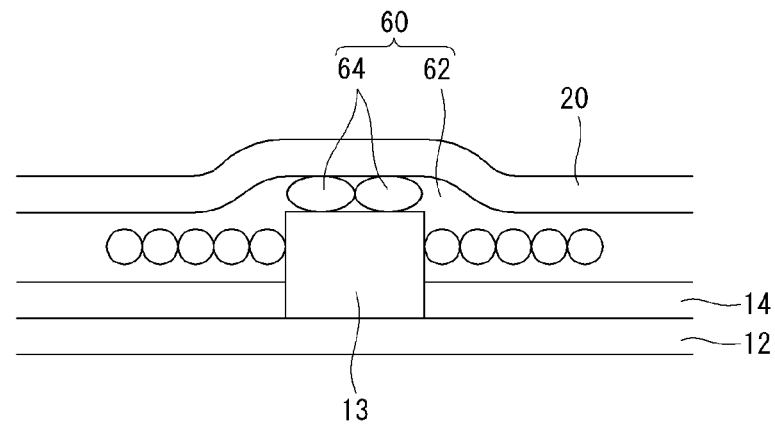
FIG. 6 is a cross-sectional view illustrating another assembly configuration of the solar cell in the solar cell panel shown in FIG. 3.

Referring to FIGS. 4-6, the conductive adhesive film 60 includes a resin 62 and conductive particles 64 dispersed in the resin 62. A material of the resin 62 is not particularly limited as long as it has the adhesive property. It is preferable, but not required, that a thermosetting resin is used for the resin 62 so as to increase an adhesive reliability. The thermosetting resin may use at least one selected among epoxy resin, phenoxy resin, acryl resin, polyimide resin, and polycarbonate resin.

The resin 62 may further contain a predetermined material, for example, a known curing agent and a known curing accelerator other than the thermosetting resin.

For example, the resin 62 may contain a reforming material such as a silane-based coupling agent, a titanate-based coupling agent, and an aluminate-based coupling agent, so as to improve an adhesive strength between the front electrodes 13 and the interconnector 20. The resin 62 may contain a dispersing agent such as calcium phosphate and calcium carbonate, so as to improve the dispersibility of the conductive particles 64. The resin 62 may contain a rubber component such as acrylic rubber, silicon rubber, and urethane rubber, so as to control the modulus of elasticity of the resin 62.

A material of the conductive particles 64 is not particularly limited as long as it has the conductivity. The conductive particles 64 may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles 64 may be formed entirely of metal particles or metal-coated resin particles, but such is not required. The conductive adhesive film 60 having the above-described configuration may include a peeling film.

It is preferable, but not required, that the conductive particles 64 use the metal-coated resin particles, so as to mitigate a compressive stress of the conductive particles 64 and improve a connection reliability of the conductive particles 64. It is preferable, but not required, that the conductive particles 64 have a diameter of about 2 µm to 30 µm, so as to improve the dispersibility of the conductive particles 64.

It is preferable, but not required, that a composition amount of the conductive particles 64 dispersed in the resin 62 is about 0.5% to 20% based on the total volume of the conductive adhesive film 60 in consideration of the connection reliability after the resin 62 is cured.

When the composition amount of the conductive particles 64 is less than about 0.5%, a current may not smoothly flow in the front electrodes 13 because a physical contact area between the front electrodes 13 and the conductive adhesive film 60 decreases. When the composition amount of the conductive particles 64 is greater than about 20%, the adhesive strength between the front electrodes 13 and the interconnector 20 may be reduced because a composition amount of the resin 62 relatively decreases.

The conductive adhesive film 60 is attached to a portion of each front electrode 13 (e.g., each of the plurality of front electrodes 13) in the direction crossing the front electrodes 13. Thus, a portion of the conductive adhesive film 60 directly contacts the portion of each front electrode 13, and a remaining portion of the conductive adhesive film 60 directly contacts the anti-reflection layer 14. Thus, the conductive adhesive film 60 is positioned between the front electrodes 13 and the interconnector 20 without an intervening layer, and/or the conductive adhesive film 60 is positioned between the anti-reflection layer 14 and the interconnector 20 without an intervening layer. Accordingly, plurality of front electrodes 13 respectively have areas that overlap with areas of the conductive adhesive film 60, and the areas of the respective plurality of front electrodes 13 are thereby also in contact with the areas of the conductive adhesive film 60. Therefore, areas of the plurality of front electrodes 13 and areas of the conductive adhesive film 60 that overlap are the same areas of the plurality of front electrodes 13 and areas of the conductive adhesive film 60 that contact.

Because the front electrode 13 protrudes further than the anti-reflection layer 14 and a plane area of the front electrode 13 is less than a plane area of the anti-reflection layer 14, an adhesive strength between the conductive adhesive film 60 and the front electrode 13 is greater than an adhesive strength between the conductive adhesive film 60 and the anti-reflection layer 14. Thus, carriers moving to the front electrode 13 may be satisfactorily transferred to the interconnector 20.

When a tabbing process is performed using the conductive adhesive film 60, a heating temperature and a pressure are not particularly limited as long as they are within the range capable of securing an electrical connection and maintaining the adhesive strength.

For example, the heating temperature may be set to a temperature capable of curing the resin 62, for example, about 150° C. to 180° C. The pressure may be set to a range capable of sufficiently attaching the front electrodes 13, the conductive adhesive film 60, and the interconnector 20 to one another. Further, a heating and pressure time may be set to the extent that the front electrodes 13, the interconnector 20, etc., are not damaged or deteriorated because of heat.

Figure 7:
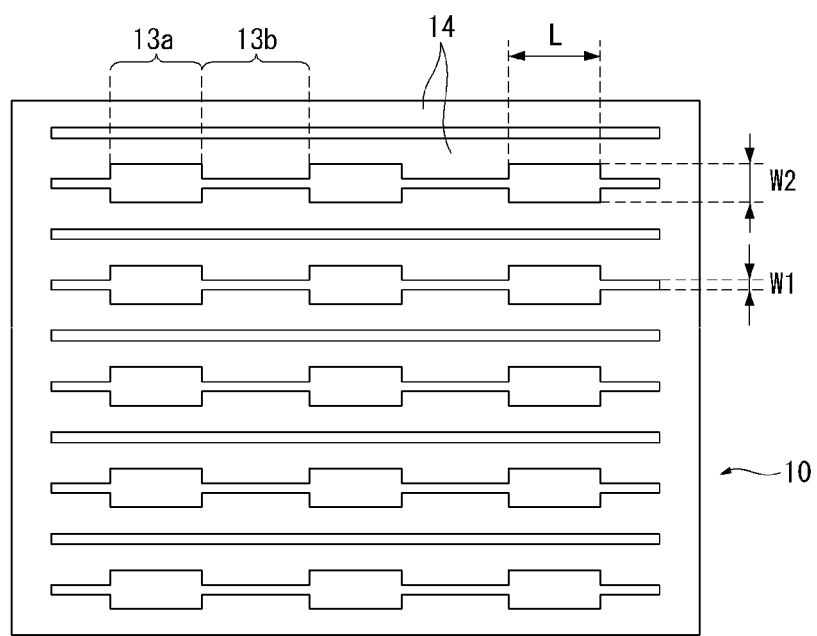
FIGS. 7 and 8 are plane views of a front surface of a substrate of the solar cell, and illustrating various configurations of a front electrode.

Referring to FIG. 7, each front electrode 13 includes a first portion 13a attached to the conductive adhesive film 60 and a second portion 13b not attached to the conductive adhesive film 60.

A portion of the interconnector 20 is attached to a front surface of the conductive adhesive film 60 attached to the first portion 13a of the front electrode 13 in the same direction as a formation direction of the conductive adhesive film 60. A remaining portion (or another end) of the interconnector 20 not attached to the conductive adhesive film 60 is attached to the back electrode current collector 16 of the adjacent solar cell 10.

As shown in FIG. 4, the resin 62 may be positioned between the conductive particles 64 and the front electrode 13 and between the conductive particles 64 and the interconnector 20 in a state where the front electrode 13 is attached to the interconnector 20 using the conductive adhesive film 60.

In this instance, carriers moving to the front electrode 13 jump to the conductive particles 64 and then again jump to the interconnector 20. Further, carriers jumping to the conductive particles 64 may jump to the adjacent conductive particles 64. Thus, the carriers moving to the front electrode 13 move to the interconnector 20 as indicated by an arrow shown in FIG. 4.

A distance between the conductive particles 64 may be properly set so that carriers can jump between the adjacent conductive particles 64. The distance between the conductive particles 64 may be set by properly adjusting the number or the size of the conductive particles 64 dispersed in the resin 62.

Thus, the carriers moving to the front electrode 13 are transferred to the interconnector 20 through the conductive particles 64.

Alternatively, as shown in FIG. 5, the conductive particles 64 may directly contact one or both of the front electrode 13 and the interconnector 20. In the structure shown in FIG. 5, because the carriers moving to the front electrode 13 are directly transferred to the interconnector 20 through the conductive particles 64, a current in the structure shown in FIG. 5 more smoothly flows than the structure shown in FIG. 4.

A remaining portion of the conductive adhesive film 60 not attached to the first portion 13a of the front electrode 13 directly contacts the anti-reflection layer 14 on the emitter layer 12.

The conductive adhesive film 60 may have a thickness T2 greater than a protruding thickness T1 of the front electrode 13, so that the conductive adhesive film 60 and the interconnector 20 are sufficiently attached to each other. In this instance, because the front surface (or the first surface) of the conductive adhesive film 60 is a flat surface, the conductive adhesive film 60 and the interconnector 20 are sufficiently attached to each other.

Because a thickness of the front electrode 13 is generally equal to or less than about 15 µm, the protruding thickness T1 of the front electrode 13 is less than about 15 µm. Thus, the thickness 12 of the conductive adhesive film 60 may be about 15 µm to 60 µm based on specifications of the solar cell to apply to the solar cell panel.

As another example, as shown in FIG. 6, the conductive adhesive film 60 may have a height difference. Further, the adjacent conductive particles 64 may physically contact one another so that carriers moving to the front electrode 13 are satisfactorily transferred to the interconnector 20. At least two conductive particles may be positioned on each front electrode 13.

When the conductive adhesive film 60 has the height difference, the interconnector 20 may have the same height difference as the conductive adhesive film 60. The interconnector 20 may have a portion, whose the surface protrudes, because of the conductive particles 64.

As shown in FIG. 6, the conductive particles 64 may be modified into an oval shape because of the pressure applied during the tabbing process. In this instance, as shown in FIGS. 3 and 4, it is preferable, but not required, that a width W3 of the conductive adhesive film 60 is greater than the thickness T2 of the conductive adhesive film 60.

In the example embodiment of the invention, the first portion 13a and the second portion 13b of the front electrode 13 have the same width W1. Alternatively, the first portion 13a and the second portion 13b of the front electrode 13 may have different widths.

As shown in FIG. 7, a width W2 of the first portion 13a of the front electrode 13 is greater than the width W1 of the second portion 13b of the front electrode 13. When the width W2 of the first portion 13a is greater than the width W1 of the second portion 13b, the adhesive strength between the conductive adhesive film 60 and the front electrode 13 is improved, and a contact resistance between the conductive adhesive film 60 and the front electrode 13 decreases. Hence, an output reduction thereof may be prevented or reduced.

The first portion 13a having the width W2 greater than the width W1 of the second portion 13b may be formed in only the front electrodes 13 positioned on predetermined rows, and the first portion 13a having the same width W1 as the second portion 13b may be formed in the front electrodes 13 positioned on remaining rows. In other words, as shown in FIG. 7, each of the front electrodes 13 positioned on even-numbered rows includes the first portion 13a having the width W2 greater than the width W1 of the second portion 13b, and each of the front electrodes 13 positioned on odd-numbered rows includes the first portion 13a having the same width as the second portion 13b.

The first portion 13a having the width W2 greater than the width W1 of the second portion 13b may be formed in only the front electrodes 13 positioned on the odd-numbered rows or may have various shapes other than the shape shown in FIG. 7. For example, the various shapes may include a triangle or a semicircle.

The first portion 13a is formed in an up-down symmetric manner based on the front electrode 13 and has a predetermined length L in a longitudinal direction of the front electrode 13. It is preferable, but not required, that the predetermined length L of the first portion 13a is equal to or less than the width W3 of the conductive adhesive film 60, so as to improve the adhesive strength between the conductive adhesive film 60 and the front electrodes 13 and reduce the contact resistance between the conductive adhesive film 60 and the front electrodes 13.

When the width W3 of the conductive adhesive film 60 is less than about 1 mm, the contact resistance increases. When the width W3 of the conductive adhesive film 60 is greater than about 20 mm, the light receiving area decreases. Thus, the width W3 of the conductive adhesive film 60 may be about 1 mm to 20 mm.

Thus, the predetermined length L of the first portion 13a may be properly set within the range of the width W3 of the conductive adhesive film 60 based on specifications of the solar cell.

Figure 8:
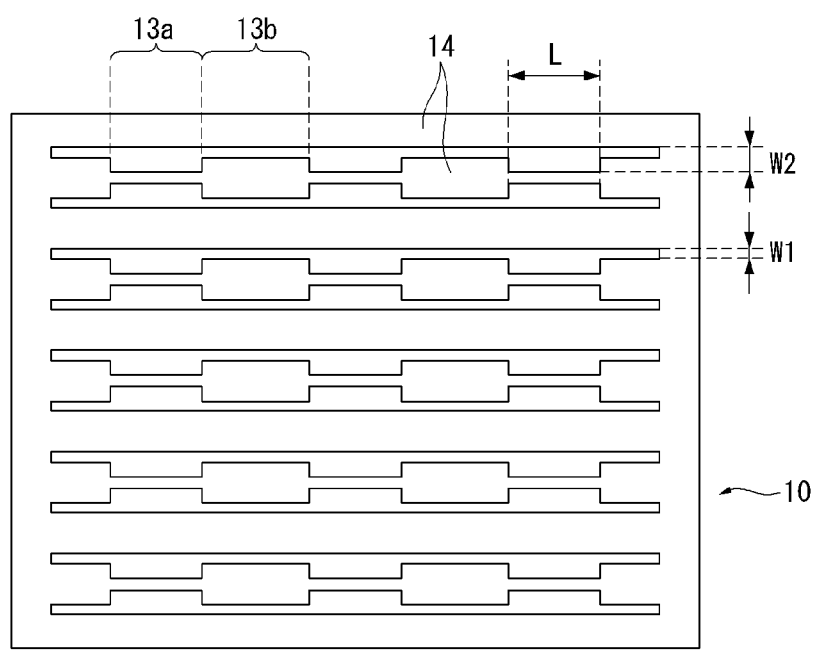

Alternatively, as shown in FIG. 8, each of the front electrodes 13 positioned on all of the rows may include the first portion 13a having the width W2 greater than the width W1 of the second portion 13b. In this embodiment of the invention, the first portions 13a extend away from the front electrodes 13, or middle portions thereof, at one side. Thus, along a length of the front electrode 13 in one row, the first portions 13a exists on only one side of the front electrode 13. In the embodiment of the invention shown in FIG. 8, the first portions 13a of adjacent front electrodes 13 face each other. But in other embodiments, the first portions 13a of the adjacent front electrodes 13 may be on the same side, respectively, so that the first portions 13a would all face towards the same side, such as downward or upward, for example. In embodiments of the invention, the first portions 13a are flaps that extend from the front electrodes 13 at one side (e.g., up-down asymmetric manner), or both sides (e.g., up-down symmetric manner) thereof.

The adjacent first portions 13a may protrude opposite each other. The adjacent first portions 13a may protrude in the same direction.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel, comprising:
a plurality of solar cells, each solar cell including a substrate, an emitter formed on a first surface of the substrate, an anti-reflection layer on the emitter, and a plurality of first electrodes extending in a first direction on the first surface of the substrate and connected to the emitter,
wherein the plurality of first electrodes include a first electrode part and a second electrode part adjacent to each other in a second direction, disposed at different rows in the second direction, and separated from each other in the second direction,
wherein a first width of a first portion of the first electrode part in the second direction is smaller than a second width of a first portion of the second electrode part in the second portion, and a third width of a second portion of the first electrode part in the second direction is the same as a fourth width of a second portion of the second electrode part in the second direction;
an interconnector that is positioned in the second direction crossing the plurality of first electrodes and electrically connects adjacent ones of the plurality of solar cells to one another, the interconnector being positioned at the first portions of the first and second electrode parts; and
a conductive adhesive film including a resin and a plurality of conductive particles dispersed in the resin, the conductive adhesive film being positioned between the plurality of first electrodes and the interconnector in the second direction and positioned at the first portions of the first and second electrode parts to electrically connect the plurality of first electrodes to the interconnector, wherein the conductive adhesive film is disposed on the anti-reflection layer at an area formed between the first electrode part and the second electrode part.

2. The solar cell panel of claim 1, further comprising:
a second electrode,
wherein the first surface of the substrate is a light incident surface, a second surface of the substrate is a back surface opposite the light incident surface, and the second electrode is disposed at the back surface of the substrate.

3. The solar cell panel of claim 1, wherein the first portion of the first electrode part and the first portion of the second electrode part are spaced apart by a first distance in the second direction, and the second portion of the first electrode part and the second portion of the second electrode part are spaced apart by a second distance in the second direction, the first distance being smaller than the second distance.

4. The solar cell panel of claim 1, wherein the first and second portions of the first electrode part have substantially the same width.

5. The solar cell panel of claim 1, wherein the first portion of the second electrode part has a predetermined length in a longitudinal direction of the plurality of first electrodes.

6. The solar cell panel of claim 5, wherein the predetermined length of the first portion of the second electrode part is equal to or less than a width of the conductive adhesive film.

7. The solar cell panel of claim 1, wherein the first portion of the second electrode part having the second width larger than the first width of the first portion of the first electrode part is formed in each of the second electrode part.

8. The solar cell panel of claim 1, wherein the first portion of the second electrode part having the second width larger than the first width of the first portion of the first electrode part is formed in an up-down symmetric manner based on a longitudinal direction of the plurality of first electrodes.

9. The solar cell panel of claim 1, wherein a first surface of the first portion of the second electrode part and a second surface of the first portion of the first electrode part facing each other are parallel to each other.

10. The solar cell panel of claim 1, wherein a first surface of the second portion of the second electrode part and a second surface of the second portion of the first electrode part facing each other are parallel to each other.

11. The solar cell panel of claim 1, wherein a first surface of the first portion of the second electrode part and a first surface of the second portion of the second electrode part are parallel to each other.

12. The solar cell panel of claim 1, wherein a second surface of the first portion of the first electrode part and a second surface of the second portion of the first electrode part are parallel to each other.

* * * * *